(12) United States Patent
Furukawa et al.

(10) Patent No.: US 10,686,294 B2
(45) Date of Patent: Jun. 16, 2020

(54) SEMICONDUCTOR ELEMENT AND METHOD OF MANUFACTURING THE SAME

(71) Applicant: NICHIA CORPORATION, Anan-Shi, Tokushima (JP)

(72) Inventors: Yoshihiko Furukawa, Tokushima (JP); Hiroyuki Deguchi, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/282,223

(22) Filed: Feb. 21, 2019

(65) Prior Publication Data
US 2019/0260178 A1   Aug. 22, 2019

(30) Foreign Application Priority Data

Feb. 22, 2018  (JP) ................................ 2018-029668

(51) Int. Cl.
*H01S 5/028* (2006.01)
*H01S 5/042* (2006.01)
(Continued)

(52) U.S. Cl.
CPC ............ *H01S 5/0282* (2013.01); *C23C 14/08* (2013.01); *C23C 14/10* (2013.01); *C23C 14/34* (2013.01); *C23C 14/3492* (2013.01); *H01L 21/0425* (2013.01); *H01L 33/44* (2013.01); *H01S 5/0425* (2013.01); *H01S 5/04252* (2019.08); *H01S 5/2054* (2013.01); *H01S 5/34333* (2013.01);
(Continued)

(58) Field of Classification Search
None
See application file for complete search history.

(56) References Cited

U.S. PATENT DOCUMENTS 7,476,903 B2 *  1/2009 Murayama ............. B82Y 20/00
                                                   257/79
2003/0039294 A1 *  2/2003 Ueki ................... H01S 5/04254
                                                   372/96
(Continued)

FOREIGN PATENT DOCUMENTS

JP      H06-077106 A     3/1994
JP      2008-103499 A    5/2008
(Continued)

*Primary Examiner* — Andres Munoz
(74) *Attorney, Agent, or Firm* — Foley & Lardner LLP

(57) ABSTRACT

A method of manufacturing a semiconductor element includes forming a first silicon oxide film on a semiconductor wafer under a first film forming condition; forming a second silicon oxide film on the first silicon oxide film under a second film forming condition, a density of the second silicon oxide film being lower than a density of the first silicon oxide film; coating, with a photoresist, a region including the second silicon oxide film; exposing the photoresist using a photomask having an aperture and being disposed such that at least a portion of an edge of the aperture is disposed on the second silicon oxide film; removing a portion of the photoresist to form a photoresist pattern that has an overhang shape in a cross-section of the photoresist pattern; forming an electrode film on a region including the photoresist pattern; and performing lift-off by removing the photoresist pattern.

16 Claims, 18 Drawing Sheets

(51) Int. Cl.
  *H01S 5/343* (2006.01)
  *H01S 5/20* (2006.01)
  *C23C 14/34* (2006.01)
  *C23C 14/08* (2006.01)
  *H01L 21/04* (2006.01)
  *C23C 14/10* (2006.01)
  *H01L 33/44* (2010.01)
  *H01S 5/22* (2006.01)
  *H01L 21/033* (2006.01)
  *H01L 21/027* (2006.01)
  *H01L 21/28* (2006.01)
  *H01L 21/44* (2006.01)

(52) U.S. Cl.
  CPC ...... *H01L 21/0272* (2013.01); *H01L 21/0331* (2013.01); *H01L 21/28* (2013.01); *H01L 21/44* (2013.01); *H01S 5/22* (2013.01); *H01S 2301/176* (2013.01); *H01S 2304/04* (2013.01)

(56) References Cited

U.S. PATENT DOCUMENTS

| | | | |
|---|---|---|---|
| 2008/0128721 A1* | 6/2008 | Watanabe | H01L 33/44 257/96 |
| 2008/0240190 A1 | 10/2008 | Kuramoto et al. | |
| 2009/0206333 A1 | 8/2009 | Kotani et al. | |
| 2011/0255294 A1 | 10/2011 | Okabe et al. | |
| 2012/0273823 A1* | 11/2012 | Yoneda | H01L 24/04 257/98 |

FOREIGN PATENT DOCUMENTS

| | | |
|---|---|---|
| JP | 2008-244423 A | 10/2008 |
| JP | 2009-081373 A | 4/2009 |
| JP | 2009-200150 A | 9/2009 |
| JP | 2010-153581 A | 7/2010 |
| JP | 2016-111254 A | 6/2016 |
| JP | 2016-171141 A | 9/2016 |

* cited by examiner

SEMICONDUCTOR ELEMENT AND METHOD OF MANUFACTURING THE SAME

CROSS-REFERENCE TO RELATED APPLICATION

This application claims priority to Japanese Patent Application No. 2018-029668, filed on Feb. 22, 2018, the contents of which are hereby incorporated by reference in their entirety.

BACKGROUND

The present disclosure relates to a semiconductor element and a method of manufacturing the same.

In a method of manufacturing semiconductor elements, a lift-off method has been widely used for forming electrodes. In forming electrodes using the lift-off method, an edge of a photoresist pattern for lift-off preferably has a reverse taper or an overhang shape in cross-section.

Japanese Patent Publication No. H06-077106 describes a method of forming a photoresist pattern comprising: forming a positive photoresist film on a substrate formed with a circuit; exposing a first region, which is a region other than a region where electrodes are to be formed, at an exposure amount smaller than a proper exposure amount; exposing a second region smaller than the first region at the proper exposure amount or an amount greater than the proper exposure amount; insolubilizing the exposed photoresist film to make insoluble to a development liquid by baking, which may be performed in an atmosphere that includes ammonia or amine-based compound; and flood exposing and developing, in which the photoresist film is formed in a reverse taper shape or in a shape having an overhang at a surface of the film."

SUMMARY

In Japanese Patent Publication No. H06-077106, forming an edge of a photoresist pattern that has a reverse taper or an overhang shape in cross-section requires an additional mask for exposure and an additional exposing step.

One object of certain embodiments of the present invention is to provide a method of manufacturing a semiconductor element in which a photoresist pattern that has a cross section with a reverse taper or an overhang shape (hereinafter collectively referred to as an "overhang shape") and that is suitable for lift-off without an additional mask for exposure and an additional exposing step.

A method of manufacturing a semiconductor element according to one embodiment of the present invention includes: forming a first silicon oxide film on a semiconductor wafer under a first film forming condition; forming a second silicon oxide film on the first silicon oxide film under a second film forming condition, the second silicon oxide film having a density lower than a density of the first silicon oxide film being formed under the first film forming condition; coating, with a photoresist, a region including the second silicon oxide film; exposing the photoresist using a photomask, the photomask having at least one aperture and being disposed such that at least a portion of an edge of the at least one aperture is disposed on the second silicon oxide film; developing a photoresist pattern formed to have a cross-section having an overhang shape by removing a portion of the photoresist using a developer solution; forming an electrode film on a region including the photoresist pattern; and performing lift-off by removing the photoresist pattern, to remove an unnecessary portion of the electrode film.

A method of manufacturing according to certain embodiments of the present invention allows for forming a photoresist pattern that is suitable for lift-off and that has a cross-section with an overhang shape and forming an electrode as expected by performing lift-off without an additional mask for exposure and an additional exposing step.

DETAILED DESCRIPTION

Hereinafter, certain embodiments of the present invention will be described with reference to the accompanying drawings.

Figure 1:
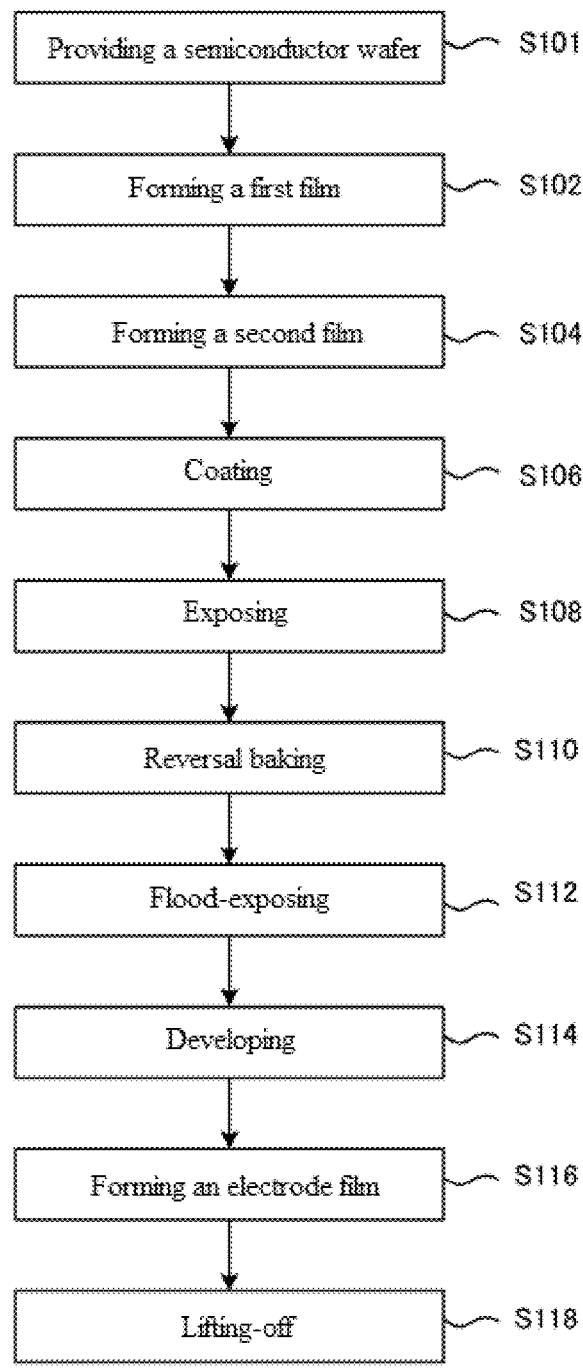
FIG. 1 is a schematic flowchart illustrating a method of manufacturing a semiconductor element according to one embodiment of the present invention.

FIG. 1 is a flowchart schematically illustrating a method of manufacturing a semiconductor element according to one embodiment of the present invention. The manufacturing method according to the present embodiment includes a step S101 of providing a semiconductor wafer, a step S102 of forming a first film, a step S104 of forming a second film, a step S106 of coating, a step S108 of exposing, a step S110 of reversal baking, a step S112 of flood-exposing, a step S114 of developing, a step S116 of forming an electrode film, and a step S118 of lifting-off.

Figure 2:
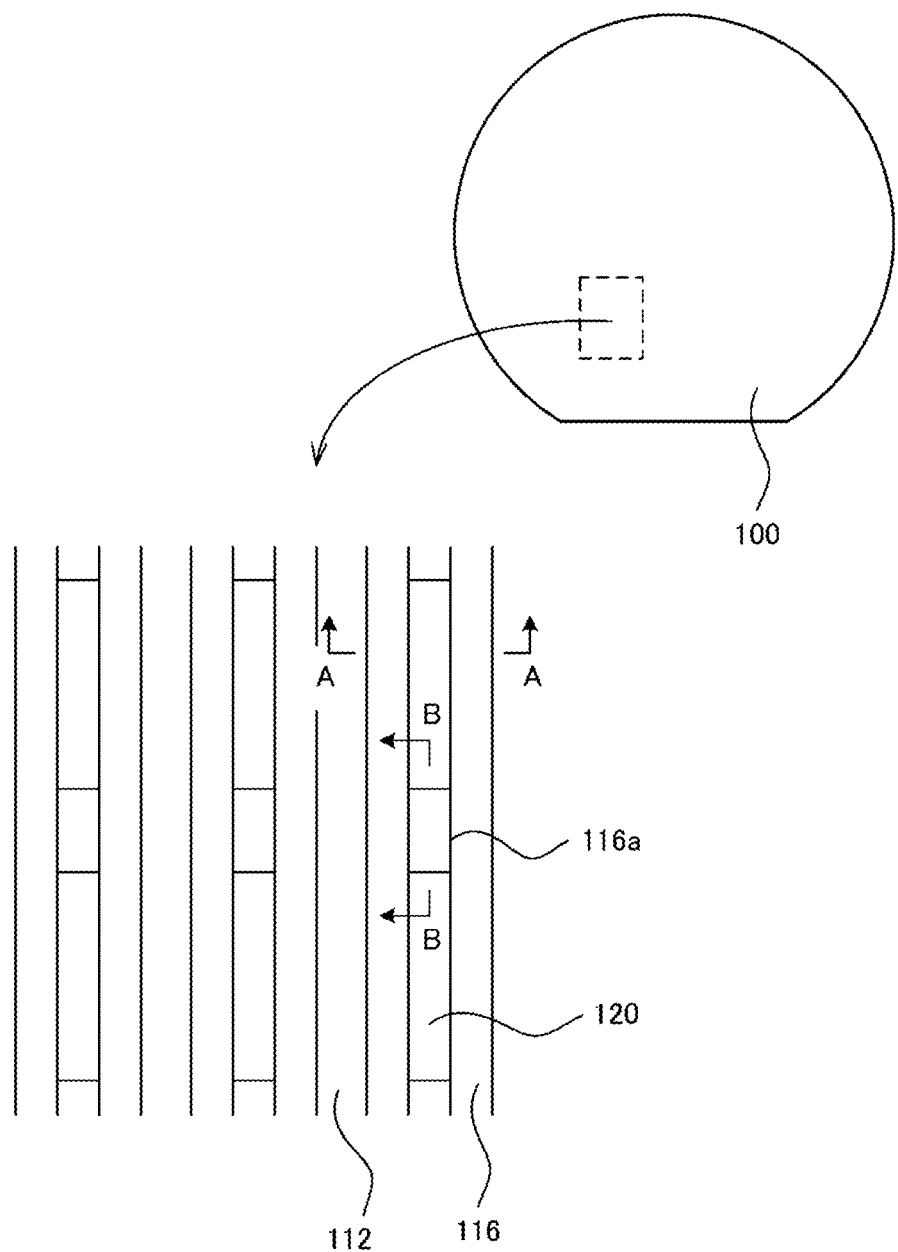
FIG. 2 is a schematic top view illustrating a semiconductor wafer that is used in the method of manufacturing the semiconductor element according to an embodiment of the present invention.

FIG. 2 is a schematic top view illustrating a semiconductor wafer that is used in the method of manufacturing the semiconductor element according to an embodiment of the present invention. A semiconductor wafer 100 shown in FIG. 2 is an example of a semiconductor wafer provided in the step S101 of providing the semiconductor wafer. A semiconductor laser element is to be formed on the semiconductor wafer 100. In a bottom-left portion of FIG. 2, a portion of the semiconductor wafer 100, which is surrounded by a broken line, is shown to be enlarged.

Figure 3:
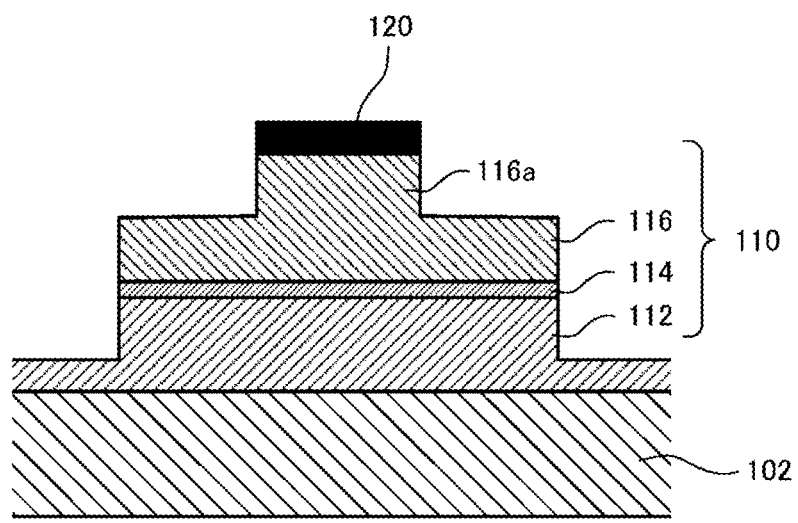
FIG. 3 is a schematic cross-sectional view taken along the line A-A of FIG. 2.
Figure 4:
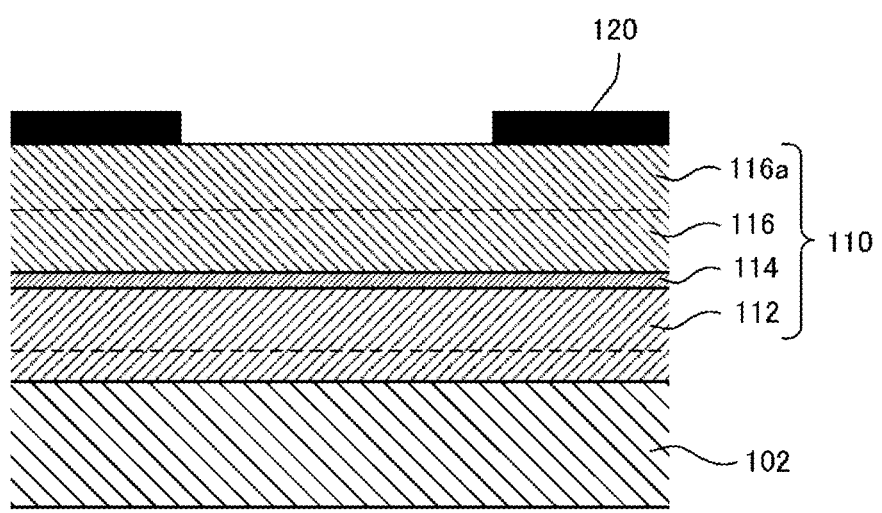
FIG. 4 is a schematic sectional view taken along the line B-B of FIG. 2.

FIG. 3 is a schematic cross-sectional view taken along the line A-A of FIG. 2. FIG. 4 is a schematic sectional view taken along the line B-B of FIG. 2. As shown in FIGS. 2 to 4, the semiconductor wafer 100 includes a substrate 102 and a semiconductor layered body 110 disposed on the substrate 102. The semiconductor layered body 110 includes an n-side semiconductor layer 112, an active layer 114, and a p-side semiconductor layer 116. The p-side semiconductor layer 116 includes a ridge 116a. A first electrode 120 is formed on the ridge 116a. For the substrate 102, for example, a sapphire ($Al_2O_3$) substrate, a SiC substrate, and a nitride semiconductor substrate can be used. Semiconductor layers on the semiconductor layered body 110 are formed by, for example, a MOCVD reactor.

The n-side semiconductor layer 112 includes an n-type semiconductor layer, for example, an n-type GaN-based semiconductor layer. In one example, a Si-doped AlGaN layer can be used for the n-type semiconductor layer. In addition to the n-type semiconductor layer, the n-side semiconductor layer 112 may also include an undoped layer containing no intentionally-added impurities. Examples of source gases to form the n-side semiconductor layer 112 include trimethylgallium (TMG) or triethylgallium (TEG) as a gallium source, trimethylaluminum (TMA) as an aluminum source, $NH_3$ as a nitrogen source gas, and a silane gas as a source material of Si.

The active layer 114 may have a single-quantum-well (SQW) structure or a multi-quantum-well (MQW) structure. An example of the MQW structure may include GaN barrier layers and InGaN well layers that are alternately layered. The active layer 114 may be formed so as to emit light having various wavelengths by adjusting a forming condition of the active layer 114. For example, an active layer that includes an InGaN well layer and emits blue light can be formed. Examples of source materials to form the active layer 114 include TMG or TEG as a gallium source, $NH_3$ as a nitrogen source, and trimethylindium (TMI) as an indium source.

The p-side semiconductor layer 116 includes a p-type semiconductor layer, for example, a p-type GaN-based semiconductor. In one example, a Mg-doped AlGaN layer can be formed. The p-side semiconductor layer 116, may include, in addition to the p-type semiconductor layer, an undoped layer that contains no intentionally added impurities. Source materials to form the p-side semiconductor layer 116 can include TMG or TEG as a gallium source, TMA as an aluminum source, and $NH_3$ as a nitrogen source. In a case of doping Mg as a p-type impurity, bis(cyclopentadienyl) magnesium ($Cp_2Mg$) can be used as a source material.

Examples of the first electrode 120 include a film of conductive oxide such as indium tin oxide (ITO), indium zinc oxide (IZO), ZnO, or $InGaZnO_4$. After forming the ridge 116a of the p-side semiconductor layer 116, a sub-step of forming a conductive oxide film may be performed, in which the first electrode 120 is formed on an upper surface of the ridge 116a. The first electrode 120 can be formed, for example, using a sputtering technique.

In the present specification, the terms "upper" and "lower," such as the "upper surface" described above, indicate a relative orientation and/or position between constituent members in the cross-sectional view, but do not indicate an absolute position unless specifically stated otherwise.

Figure 5:
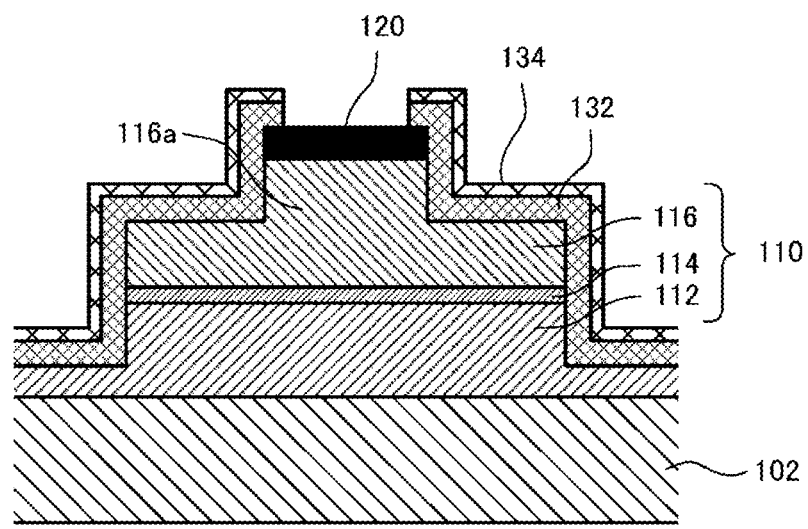
FIG. 5 is a schematic cross-sectional view taken along the line A-A of FIG. 2 after completion of forming of a first film and a second film.
Figure 6:
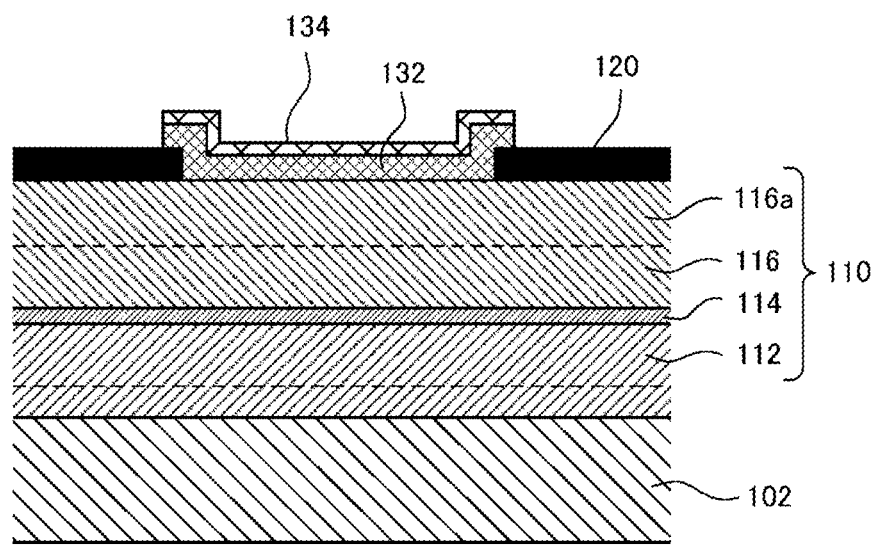
FIG. 6 is a schematic sectional view taken along the line B-B of FIG. 2 after completion of forming of the first film and the second film.

FIG. 5 is a schematic cross-sectional view taken along the line A-A of FIG. 2 after completion of forming of the first film and a second film. FIG. 6 is a schematic sectional view taken along the line B-B of FIG. 2 after completion of forming of the first film and the second film.

In the step S102 of forming the first film, a first silicon oxide film 132 is formed on the semiconductor wafer 100 under a first film-forming condition. As shown in FIGS. 5 and 6, the first silicon oxide film 132 may be formed to cover side surfaces of the ridge 116a. The first silicon oxide film 132 may further be formed to cover edges of the first electrode 120. The first silicon oxide film 132 is preferably formed so that at least a part of first silicon oxide film 132 covers surfaces of the semiconductor layered body 110 at both sides of the ridge 116a. This structure allows a light in the semiconductor layered body 110 to be confined in a region directly below the ridge 116a (i.e., an optical waveguide region) due to a difference between a refractive index of the semiconductor layered body 110 and a refractive index of the first silicon oxide film 132. An effect similar to the above can be obtained also in the case in which the ridge 116a is not formed. Also, the first silicon oxide film 132 disposed on the semiconductor layered body 110 allows for providing insulation between the semiconductor layered body 110 and a second electrode to be formed later.

The first silicon oxide film 132 preferably has a high density to exhibit an effect of insulation and an effect of reducing a voltage rise to be described below. For example, the first silicon oxide film 132 is preferably an oxide film that allows for reducing a voltage rise rate to be 3% or less when a resulting semiconductor laser element is operated continuously for one hour. For forming such an oxide film, the first silicon oxide film 132 is preferably formed under the first film-forming condition in which the first silicon oxide film 132 is formed using a sputtering device at a deposition pressure of 0.2 Pa or less. The deposition pressure can be 0.1 Pa or more. The first silicon oxide film 132 is more preferably formed at a deposition pressure of 0.13 Pa or less. Also, the first silicon oxide film 132 may have a thickness of 50 nm or more and 250 nm or less.

In the step S104 of forming the second film, a second silicon oxide film 134 is formed on the first silicon oxide film 132 under a second film forming condition, which allows the second silicon oxide film to have a density lower than a density of the first silicon oxide film. A study by the inventors of the present invention has revealed that, when a photoresist pattern is formed on a silicon oxide film having a low density, an edge of the photoresist pattern has a cross-section with an overhang shape. Such an overhang shape is suitable for lift-off. Thus, the second silicon oxide film 134 is provided to form the second electrode by lift-off in a later step.

Figure 7:
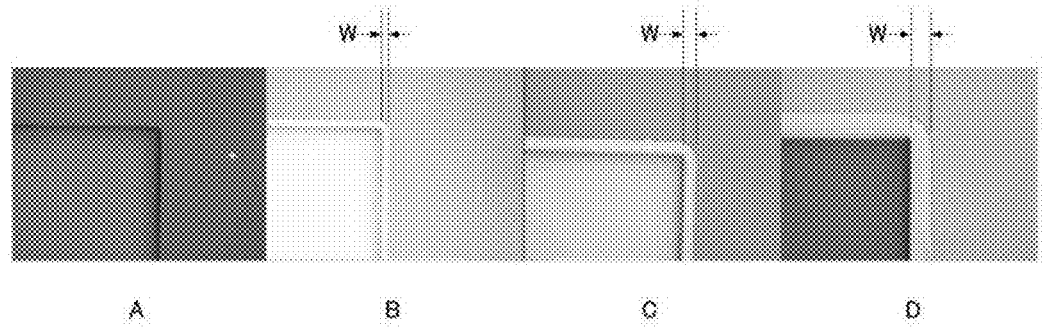
FIG. 7 shows experimental results each showing an edge of a photoresist pattern formed on a silicon oxide film.

FIG. 7 depicts images of experimental results each showing an edge of a photoresist pattern on a silicon oxide film. In the experiment, four types of samples, denoted as A, B, C, and D in FIG. 7, were formed under different film forming conditions of the silicone oxide films for comparison. In all samples, the silicon oxide film was formed on the GaN substrate using a sputtering device. Then, the photoresist pattern was formed on the silicon oxide film. The silicon oxide film was formed under two types of film forming pressure, namely 0.1 Pa and 0.7 Pa.

Before the experiment, etching rates of the silicon oxide films, each of which was formed at deposition pressures of 0.1 Pa and 1.0 Pa, in a solution containing buffered hydrofluoric acid (BHF) was measured. As a result, the etching rate of the silicon oxide film formed at 1.0 Pa was higher than that of the silicon oxide film formed at 0.1 Pa. Accordingly, it can be considered that a silicon oxide film formed at a higher deposition pressure has a lower density. Thus, in the experiment, the silicon oxide film formed at a deposition pressure of 0.1 Pa corresponds to the first silicon oxide film 132, and the silicon oxide film formed at a deposition pressure of 0.7 Pa corresponds to the second silicon oxide film 134. The solution that was used to confirm the etching rate was obtained by diluting a BHF containing 15.7% $NH_4HF_2$ with water by 100 times.

In the sample A, only the first silicon oxide film was formed to have a thickness of 200 nm before the resist pattern was formed. In the sample B, the first silicon oxide film was formed to have a thickness of 190 nm, and the second silicon oxide film was formed to have a thickness of 10 nm on the first silicon oxide film, and then the resist pattern was formed. In the sample C, the first silicon oxide film was formed to have a thickness of 150 nm, and the second silicon oxide film was formed to have a thickness of 50 nm on the first silicon oxide film, and then the resist pattern was formed. In the sample D, only the second silicon oxide film was formed to have a thickness of 200 nm before the resist pattern was formed.

In FIG. 7, planar photographs of the samples are shown. If the edge of the resist pattern has an overhang shape, the portion having the overhang shape has a lower thickness and exhibits a color different from a color of the other part of the resist pattern due to change in optical interference. The formation of the overhang shape can be thus confirmed. In FIG. 7, an overhang width of a portion with an overhang shape that appears in each photograph is denoted by W. As shown in FIG. 7, the overhang width of the sample A is small and can hardly be recognized with a magnification of the photograph. The overhang shape can be seen in the samples B, C, and D, which have the overhang widths greater in the order of B, C, and D. The sample D has the width W of approximately 6 μm. The results revealed that the larger the thickness of the second silicon oxide film is, the larger the overhang width becomes.

The larger the overhang width is, the more successfully lift-off is performed. Thus, in the case of forming an electrode film on the samples B, C, and D in which the overhang is observed, lift-off is more likely to succeed. On the other hand, in the case of forming the electrode film on the sample A in which overhang is not observed, lift-off is less likely to succeed.

In addition, experiments were performed using silicon oxide films formed by the sputtering device at deposition pressures of 0.4 Pa and 0.5 Pa. The results revealed that, with a silicon oxide film formed at a deposition pressure in the range of 0.1 Pa to 1.0 Pa, the higher the deposition pressure of the silicon oxide film is, the higher the etching rate of the silicon oxide film in BHP becomes (that is, the lower the density becomes). It was also found that the higher the deposition pressure of the silicon oxide film is, the larger the overhang width of the resist pattern formed on the silicon oxide film becomes. This is considered to be because reduction in a film quality of a silicone oxide film changes reflectance or transmittance of the silicone oxide film with respect to exposure light, which causes reduction in an amount of exposure to a resist on a silicon oxide film with a lower film quality compared to an amount of exposure to a resist on a silicon oxide film with a higher film quality. In addition, silicon oxide films were formed using the sputtering device under deposition pressures of 0.1 Pa and 0.5 Pa, respectively, and contact angles of the silicone films with water were measured. The silicon oxide film formed under the deposition pressure of 0.5 Pa had a smaller contact angle. Accordingly, an increase in the overhang width of the resist pattern can be considered to be due to easy entry of a developer solution, which is used for removing the photoresist pattern, between the resist and the silicon oxide film with a low density.

As described above, the second silicon oxide film is provided to form the second electrode by lift-off in a later step. The second silicon oxide film is preferably a silicon oxide film on which the resist pattern can be formed to have a large overhang width that allows for forming the second electrode substantially as designed using a lift-off technique. That is, the second silicon oxide film is preferably a silicon oxide film that allows for, when performing lift-off of the resist pattern and the electrode film on the second silicon oxide film, successfully performing lift-off without remaining the electrode film on the resist pattern.

In the step S104 of forming the second film, the second silicon oxide film is preferably formed using a sputtering device under a deposition pressure of 0.4 Pa or more, which is the second film forming condition. The higher the deposition pressure is, the lower the density becomes. However, an excessively low density may deteriorate insulation. Thus, the deposition pressure of the second silicon oxide film is preferably 0.7 Pa or less. The second silicon oxide film is more preferably formed under a deposition pressure of 0.5 Pa or more and 0.7 Pa or less.

In the case of using an ITO film for the first electrode 120 in the semiconductor laser element, it was found that voltage of the semiconductor laser element was greatly increased when the step S102 of forming the first film was not performed and only the second silicon oxide film 134 that has a low density was formed on the semiconductor wafer 100 without forming the first silicon oxide film 132 that has a high density. That is, it was found that, in the case where the semiconductor laser element was manufactured such that the first silicon oxide film 132 was not formed, and the second silicon oxide film 134 was directly in contact with the first electrode 120 and the semiconductor layered body 110 in FIGS. 5 and 6, increase in voltage became prominent. Increase in voltage was confirmed by continuously operating each semiconductor laser element at a constant current four one hour, and then measuring the voltage after one hour of operation and comparing the voltage after one hour of operation with the voltage at the start of operation. The second silicon oxide film 134, which has a low density, is thought to include many impurities. The impurities in the second silicon oxide film 134 may move to the ITO electrode due to increase in temperature during operation of the semiconductor laser element. The movement of the impurities in the second silicon oxide film 134 to the ITO electrode may cause reduction in conductivity of the ITO electrode, so that voltage of the semiconductor laser element may be increased. Such increase in voltage may be likely to occur particularly in a semiconductor laser element that has a high power output and of which the temperature during operation is likely to increase.

In the method of manufacturing the semiconductor element of the present embodiment, the first silicon oxide film 132 having a high density is formed to be in contact with the first electrode 120 and the semiconductor layered body 110 in the step S102 of forming the first film. Further, in order to form the resist pattern that is suitable for lift-off, the second silicon oxide film 134 having a low density is formed on the first silicon oxide film 132 in the step S104 of forming the second film. This can reduce the degree of increase in voltage during operation of the semiconductor element in a case of using the conductive oxide film, such as the ITO film, for the first electrode that is in contact with the silicon oxide film.

The second silicon oxide film 134 is preferably not in direct contact with the first electrode 120 and the semiconductor layered body 110 to prevent adverse effects from the second silicon oxide film 134. Further, the first silicon oxide film 132 and the second silicon oxide film 134 are preferably patterned using the same mask or patterned so that that the second silicon oxide film 134 is disposed entirely inward of the first silicon oxide film 132 in a top view. It is preferable that a thickness of the second silicon oxide film 134 is not increased too much to the degree that allows for forming the resist pattern having an overhang that can form the second electrode substantially as designed using a lift-off technique. For example, the thickness of the second silicon oxide film 134 is preferably one quarter or less of a total thickness of the first silicon oxide film 132 and the second silicon oxide film 134.

Figure 8:
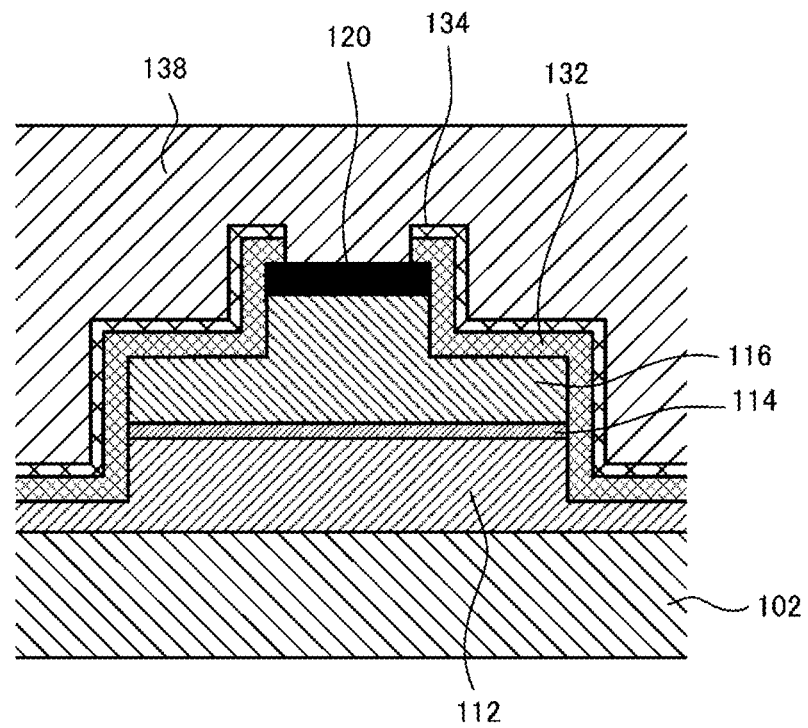
FIG. 8 is a schematic cross-sectional view taken along the line A-A of FIG. 2 after completion of coating with a resist.

FIG. 8 is a schematic cross-sectional view taken along the line A-A of FIG. 2 after completion of a step of coating with a resist. In the step S106 of coating, a region including the second silicon oxide film 134 is coated with a photoresist 138. In the present embodiment, the photoresist 138 is a positive resist.

Figure 9:
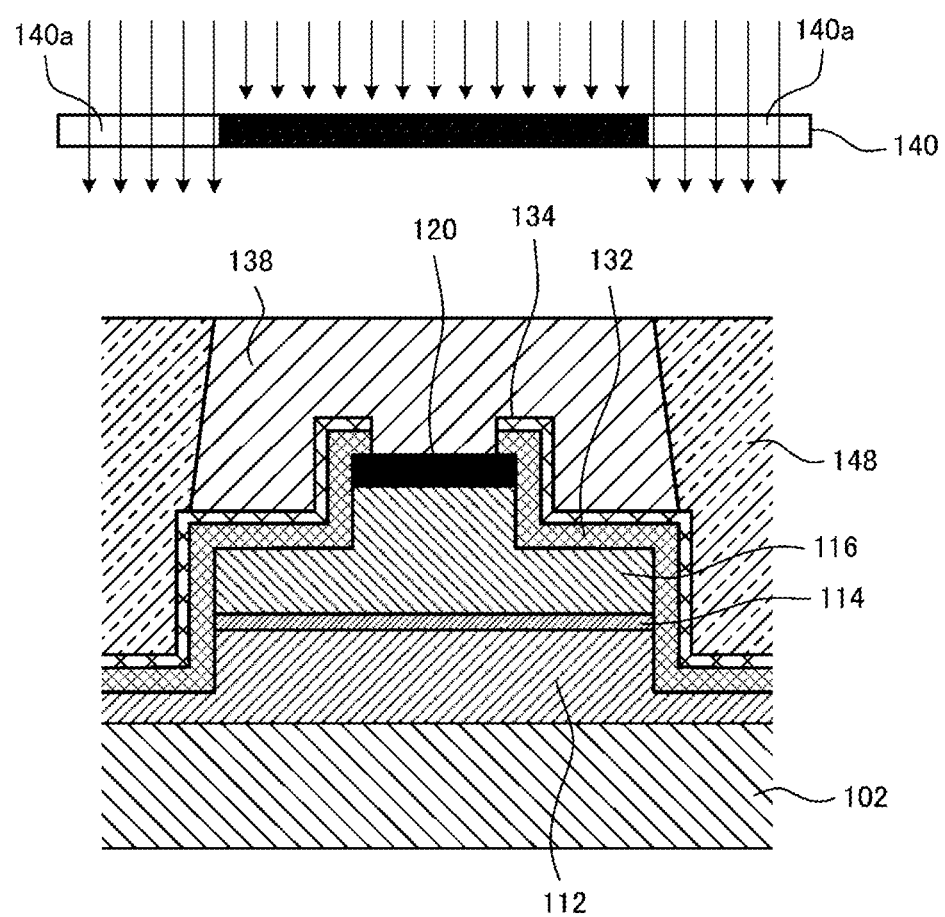
FIG. 9 is a schematic cross-sectional view taken along the line A-A of FIG. 2 illustrating exposing.

FIG. 9 is a schematic cross-sectional view taken along the line A-A of FIG. 2 illustrating a step of exposing. In the step S108 of exposing, a photomask 140 having one or more apertures 140a is disposed such that at least a portion of an edge of the aperture 140a is disposed above the second silicon oxide film 134, and the photoresist 138 is exposed. In FIG. 9, a portion of the photoresist 138 being exposed by a light passing through the aperture 140a is indicated as an exposed resist 148. The above arrangement of the photomask 140 enables a boundary of the exposed resist 148 and an unexposed portion of the photoresist 138 to be located on the second silicon oxide film 134.

The exposure is performed at an amount that allows the boundary of the exposed resist 148 and an unexposed portion of the photoresist 138 to form the overhang shape, as shown in FIG. 9. The lower the amount of exposure is, the larger the overhang width tends to be. However, as described above, forming the photoresist 138 on the second silicon oxide film 134 allows for easily forming the overhang shape. Accordingly, for example, the amount of exposure to form the overhang shape may be the same as the amount of exposure needed to form the photoresist 138 on the first silicon oxide film 132.

Figure 10:
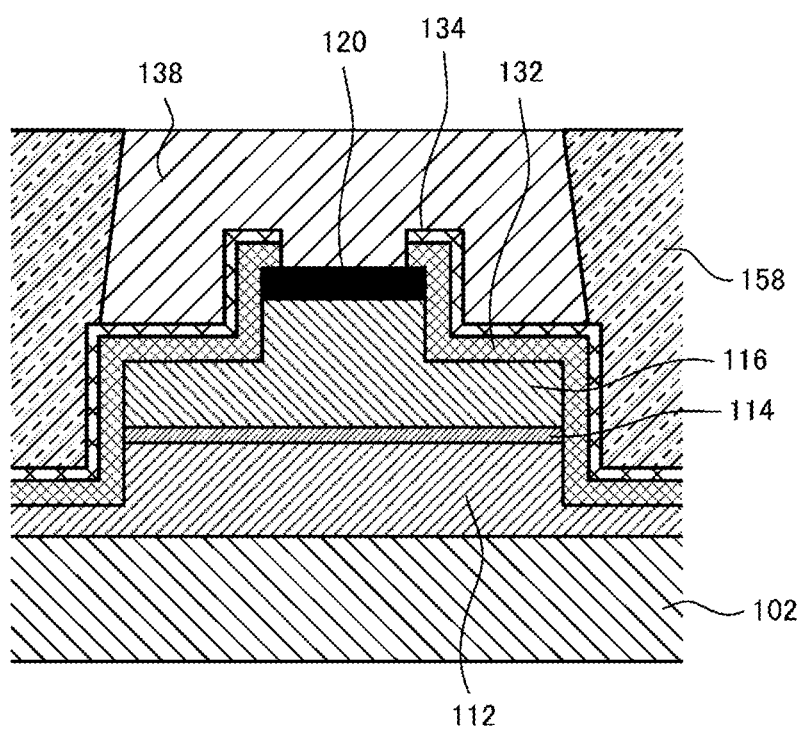
FIG. 10 is a schematic cross-sectional view taken along the line A-A of FIG. 2 after completion of reversal baking.

FIG. 10 is a schematic cross-sectional view taken along the line A-A of FIG. 2 after completion of a step of reversal baking. In the step S110 of reversal baking, by baking, the exposed resist 148, which is the exposed portion of the photoresist 138, becomes insoluble to the developer solution. In FIG. 10, a portion of the photoresist that is made insoluble to the developer solution by baking is indicated as a modified resist 158.

Figure 11:
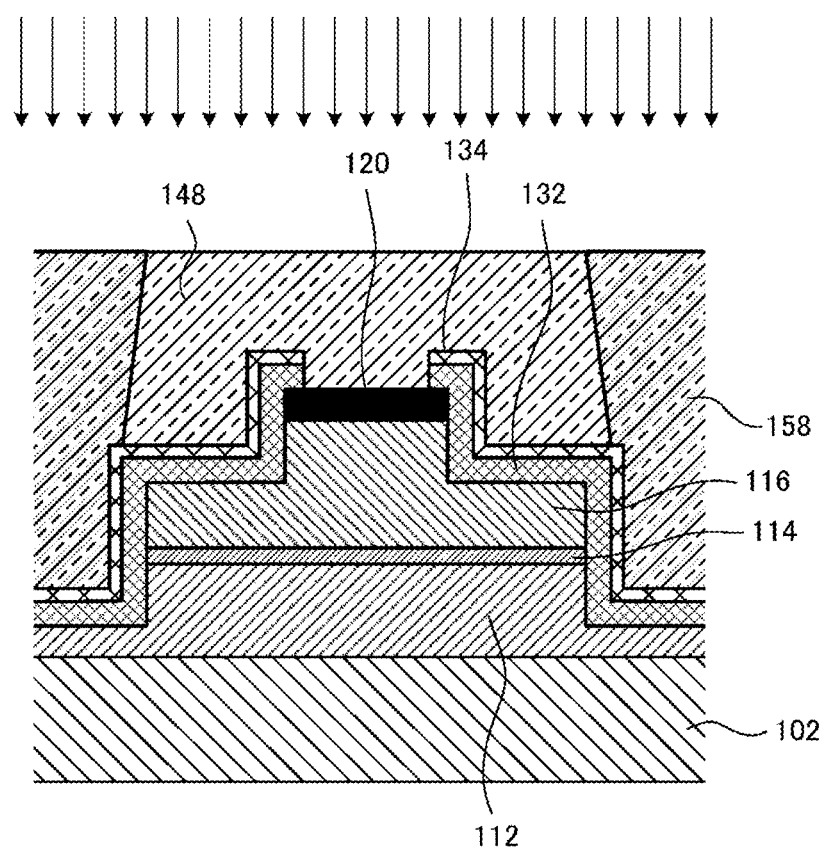
FIG. 11 is a schematic cross-sectional view taken along the line A-A of FIG. 2 illustrating flood exposing.

FIG. 11 is a schematic cross-sectional view taken along the line A-A of FIG. 2 illustrating a step of flood-exposing. In the step S112 of flood-exposing, an entirety of a surface of the photoresist is exposed. In the flood exposing, the unexposed portion of the photoresist 138 that remains unexposed during the step S108 of exposing is exposed, and thus becomes the exposed resist 148. The amount of exposure in the step S112 of flood exposing is preferably larger than the amount of exposure in the step S108 of exposing. This allows for more securely exposing the entirety of the photoresist 138.

Figure 12:
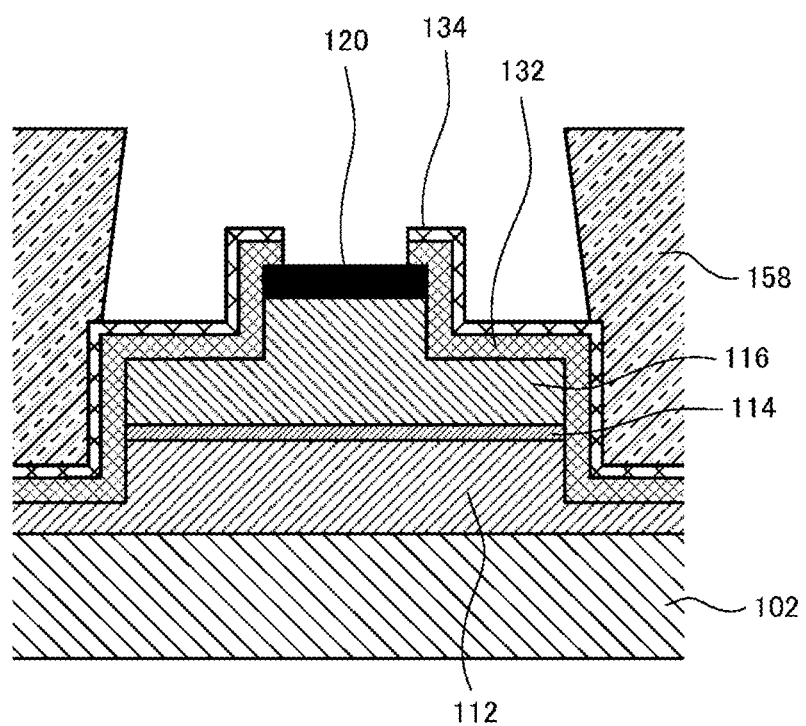
FIG. 12 is a schematic cross-sectional view taken along the line A-A of FIG. 2 after completion of developing.
Figure 13:
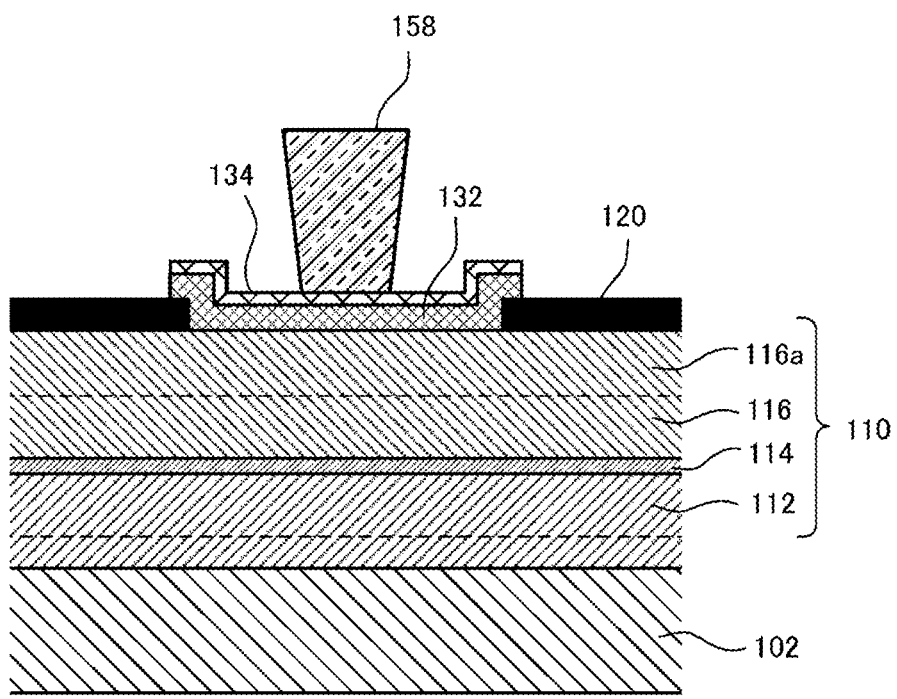
FIG. 13 is a schematic sectional view taken along the line B-B of FIG. 2 after completion of developing.

FIG. 12 is a schematic cross-sectional view taken along the line A-A of FIG. 2 after completion of a step of developing. FIG. 13 is a schematic sectional view taken along the line B-B of FIG. 2 after completion of the step of developing. In the step S114 of developing, the exposed resist 148, which is an exposed part of the photoresist, is removed by the developer solution, and thus the photoresist pattern is formed. After the exposed resist 148 is removed, the modified resist 158 remains. Thus, the edge of the photoresist pattern has an overhang shape in cross-section. The second silicon oxide film 134 as described above allows for obtaining such an effect. FIGS. 9 to 11 are conceptual drawings, and as long as an overhang shape is obtained as shown in FIG. 12, any appropriate procedure may be performed to form the overhang shape. For example, if the exposed resist 148 does not have an overhang shape at the time of FIG. 9, the developer solution easily enters between the resist and the second silicon oxide film 134 having a small contact angle with water during the developing as described above, which may form an overhang shape.

Figure 14:
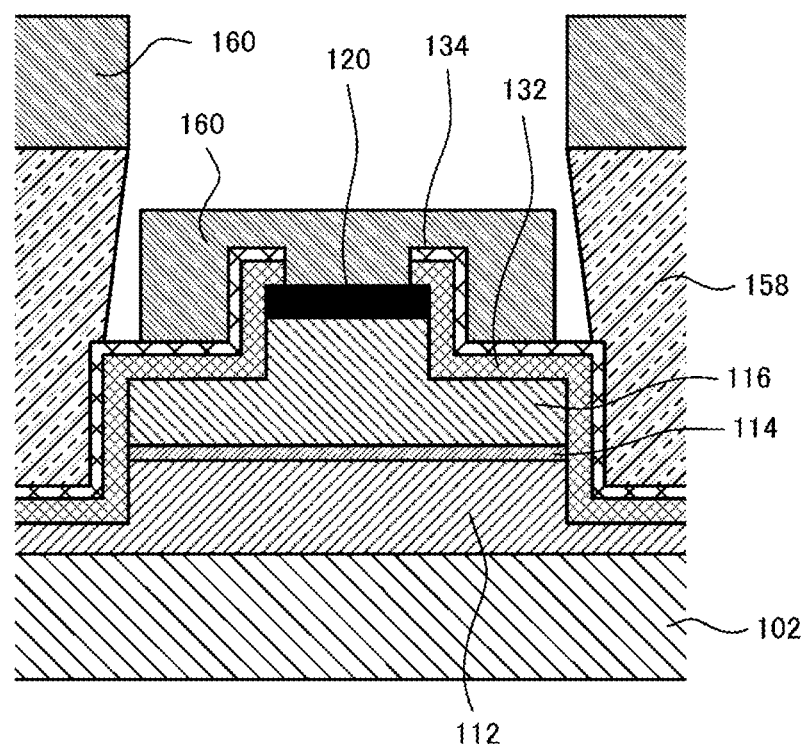
FIG. 14 is a schematic cross-sectional view taken along the line A-A of FIG. 2 after completion of forming of an electrode film.
Figure 15:
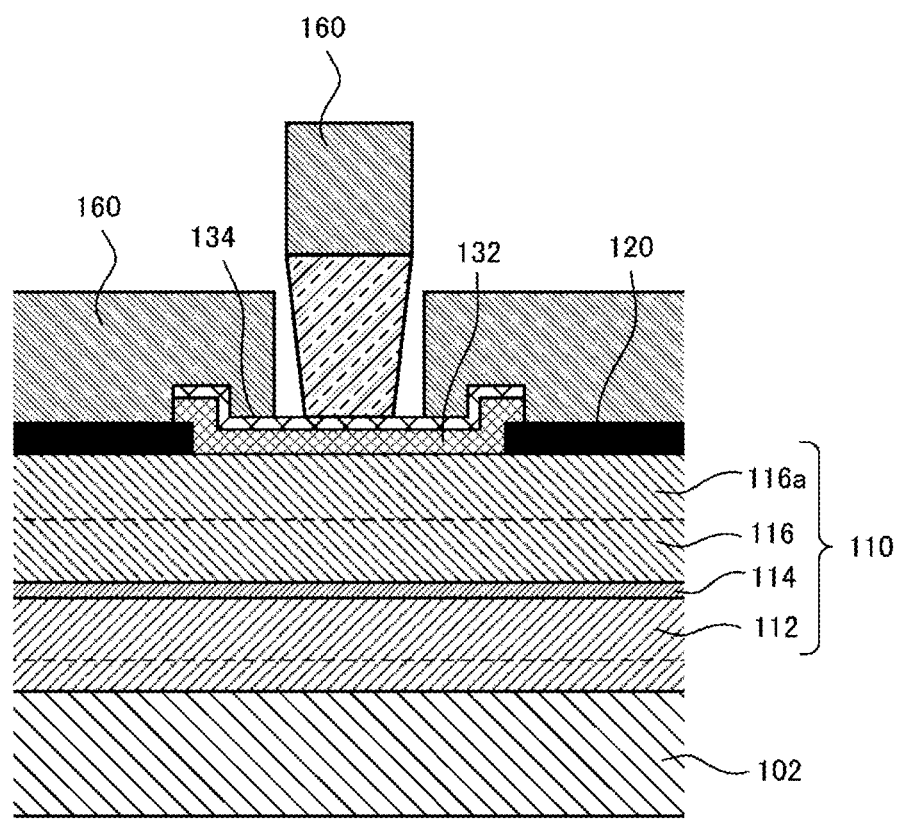
FIG. 15 is a schematic sectional view taken along the line B-B of FIG. 2 after completion of forming of the electrode film.

FIG. 14 is a schematic cross-sectional view taken along the line A-A of FIG. 2 after completion of a step of forming an electrode film. FIG. 15 is a schematic cross-sectional view taken along the line B-B of FIG. 2 after completion of the step of forming the electrode film. In the step S116 of forming the electrode film, the electrode film 160 is formed on a region that includes the photoresist pattern. The electrode film 160 can be formed by, for example, vapor deposition or sputtering. Examples of preferable materials for the electrode film 160 include an elemental metal such as Ag, Al, Ni, Rh, Au, Cu, Ti, Pt, Pd, Mo, Cr, W, and an alloy containing these metals as a main component. For example, Ti and Au are layered in turn to form the electrode film 160. As shown in FIGS. 14 and 15, with the photoresist having the overhang shape, the electrode film 160 is hardly attached to a portion under the edge of the photoresist pattern. Thus, the electrode film 160 is separated from the edge of the photoresist pattern, and thus lift-off is easily performed.

Figure 16:
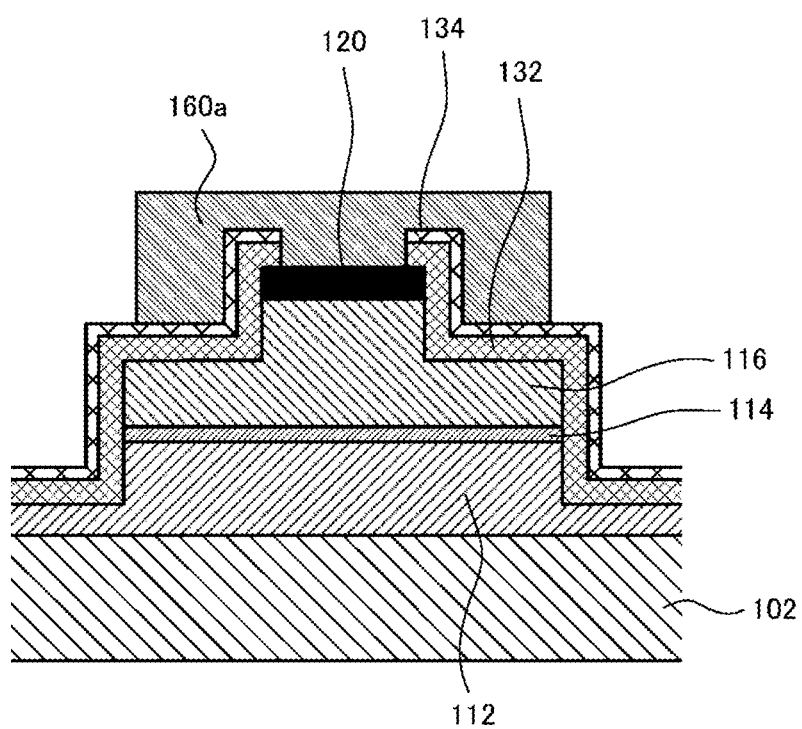
FIG. 16 is a schematic cross-sectional view taken along the line A-A of FIG. 2 after completion of lift-off.
Figure 17:
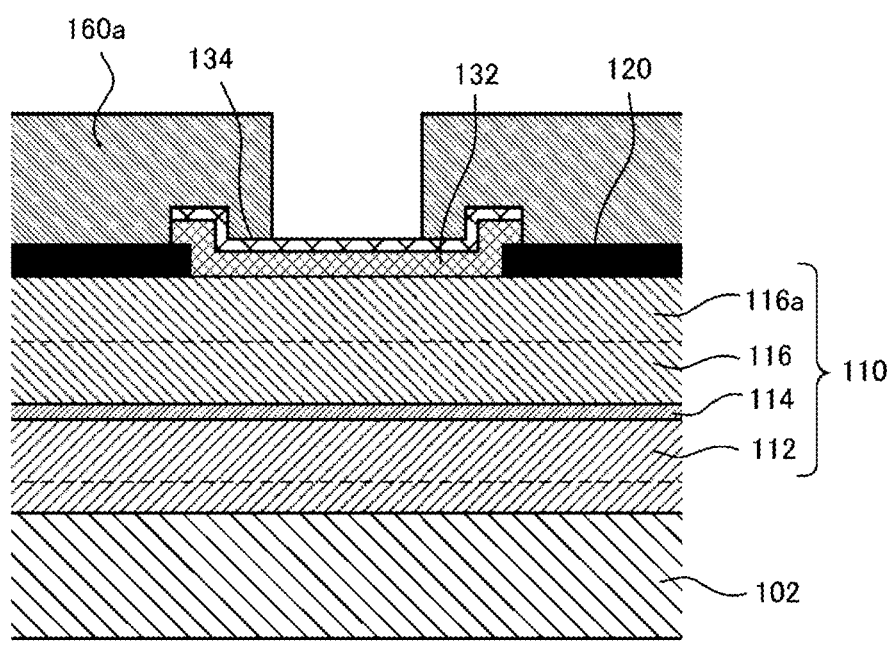
FIG. 17 is a schematic sectional view taken along the line B-B of FIG. 2 after completion of lift-off.

FIG. 16 is a schematic cross-sectional view taken along the line A-A of FIG. 2 after completion of a step of performing lift-off. FIG. 17 is a schematic sectional view taken along the line B-B of FIG. 2 after completion of the step of performing lift-off. In the step S118 of performing lift-off, the photoresist pattern is removed, causing an unnecessary portion of the electrode film 160 to be removed. The remaining portion of the electrode film 160 will become a second electrode 160a. The second electrode 160a is so-called a pad electrode to which a wire or the like for an electrical connection to an external power source or the like will be connected.

With the manufacturing method according to the present embodiment, the first silicon oxide film 132 can provide insulation, and the second silicon oxide film 134 allows for forming the resist pattern that is suitable for lift-off. Thus, an electrode as intended can be formed using a lift-off technique without an additional mask for exposure and an additional step of exposing.

Figure 18:
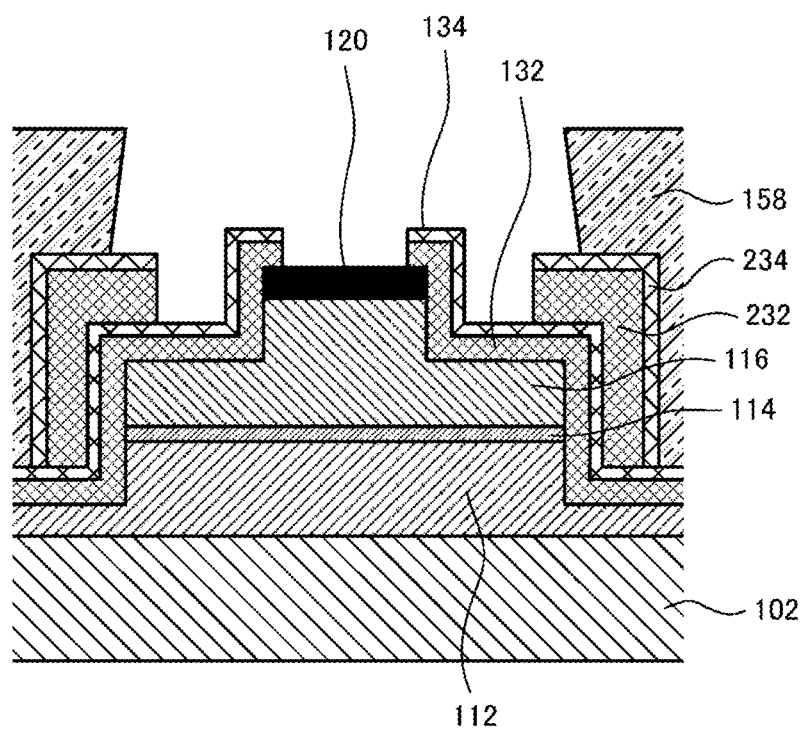
FIG. 18 is a schematic cross-sectional view illustrating a method of manufacturing a semiconductor element according to another embodiment of the present invention.

FIG. 18 is a schematic cross-sectional view illustrating a method of manufacturing a semiconductor element according to another embodiment of the present invention, which is a variant example of the embodiment described above. In the present embodiment, members, portions, and elements that have the same functions as the embodiment described above are denoted by the same reference numerals, and description thereof may be omitted.

As shown in FIG. 18, an additional silicon oxide film may further be formed on a portion of the first silicon oxide film 132 and the second silicon oxide film 134. In this case, the additional silicon oxide film on which the edge of the photoresist pattern is located preferably has a two-layer structure, similar to the first silicon oxide film 132 and the second silicon oxide film 134, as shown in FIG. 18. In FIG. 18, the additional silicon oxide film includes a third silicon oxide film 232 having a high density and a fourth silicon oxide film 234 having a low density. The method of manufacturing according to the present embodiment includes, for example, a step of forming a third film, in which the third silicon oxide film 232 are formed, and a step of forming a fourth film, in which the fourth silicon oxide film 234 is formed, between the step S104 of forming the second film and the step S106 of coating in the manufacturing flow shown in FIG. 1.

In the present embodiment, the third silicon oxide film 232 and the fourth silicon oxide film 234 serve as a passivation film that protects the semiconductor element from moisture, metal ions, and the like. If any portion of the third silicon oxide film 232 and the fourth silicon oxide film 234 is not in direct contact with the first electrode 120 and the semiconductor layered body 110, the additional silicon oxide film does not necessarily have a two-layer structure and may have only the fourth silicon oxide film 234 having a low density.

Figure 19:
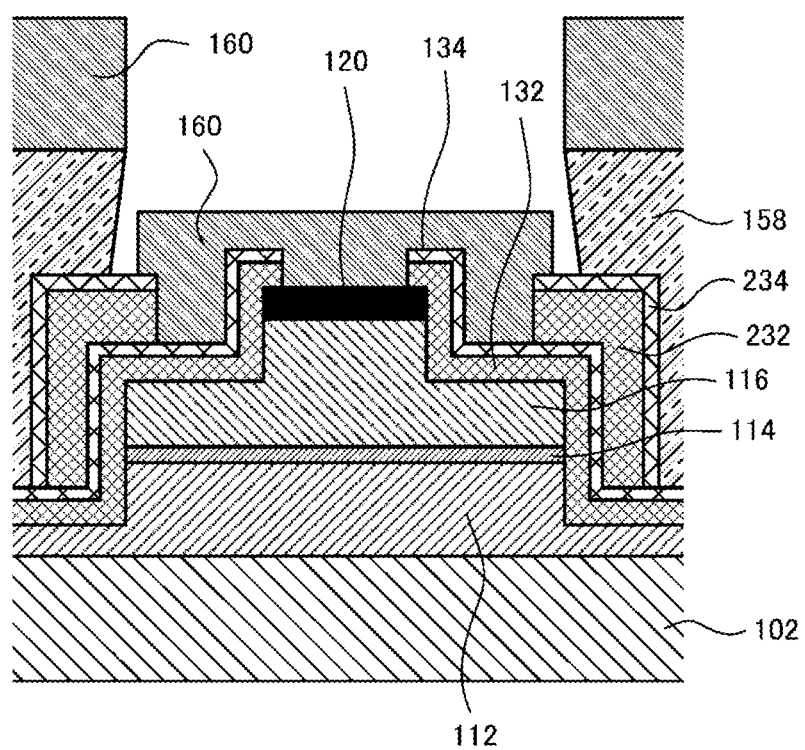
FIG. 19 is a schematic cross-sectional view after the electrode film has been formed according to the embodiment shown in FIG. 18.
Figure 20:
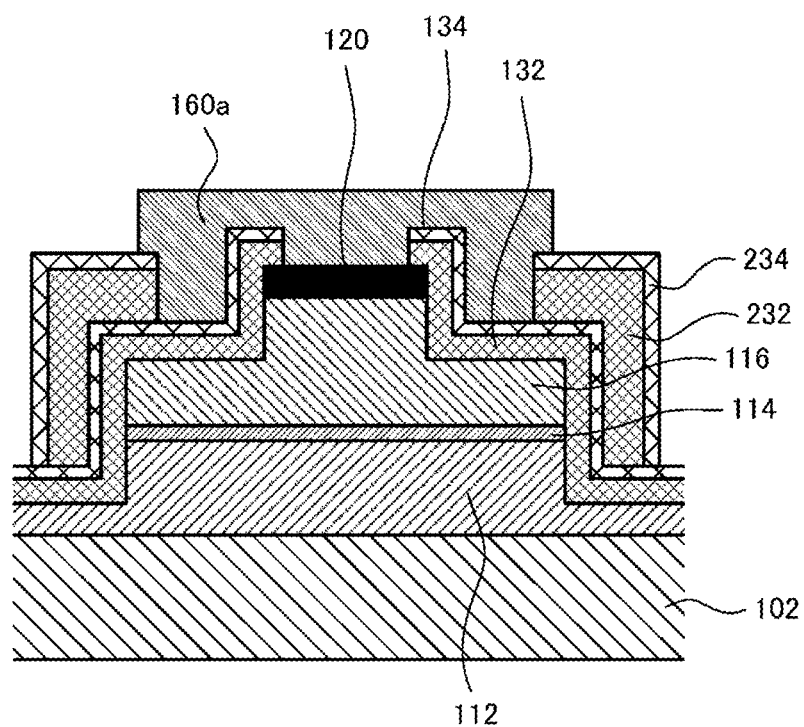
FIG. 20 is a schematic cross-sectional view after completion of the lift-off subsequent to the state shown in FIG. 19.
Figure 21:
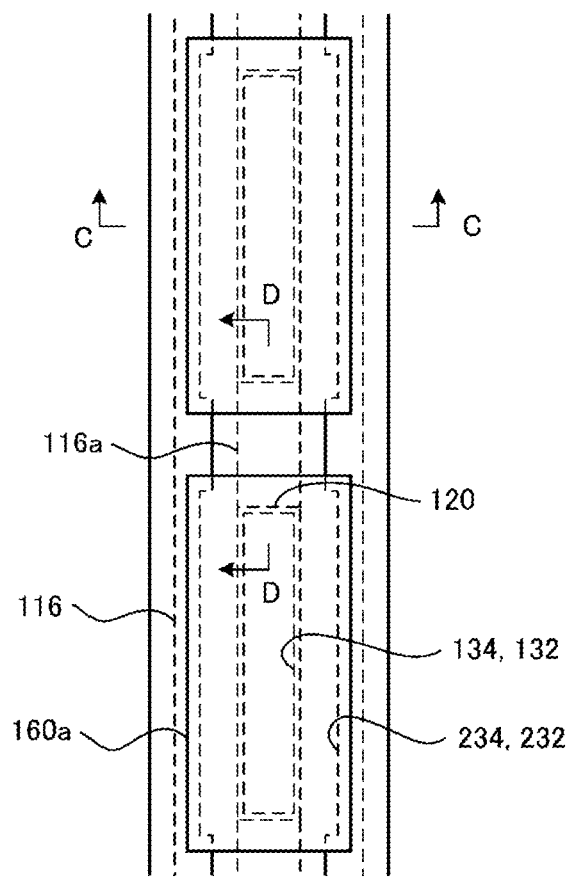
FIG. 21 is a schematic plan view of the semiconductor element shown in FIG. 20.

FIG. 19 is a schematic cross-sectional view after forming the electrode film according to the embodiment shown in FIG. 18. FIG. 20 is a schematic cross-sectional view after completion of the step of performing lift-off subsequent to the condition shown in FIG. 19. FIG. 21 is a schematic plan view of the semiconductor element shown in FIG. 20. FIG. 20 is also a schematic cross-sectional view taken along the line C-C in FIG. 21. A schematic cross-sectional view taken along the line D-D is the same as FIG. 17. As shown in the present embodiment, by forming the fourth silicon oxide film 234 having a low density, a cross-section of the edge of the photoresist pattern has an overhang shape, which is the suitable for lift-off and has the same effect as in the embodiment described above.

The present invention is not limited to the embodiments described above, and includes various modifications. The embodiments described above are illustrated in detail to facilitate understanding of the present invention, and the present invention is not limited to a method of manufacturing that include all the structures and steps described above. For example, in the embodiments described above, the photoresist 138 is a positive resist and the step S108 of exposing is followed by the step S110 of reversal baking and the step S112 of flood-exposing, but the photoresist 138 may be a negative resist. In the case of using a negative resist, the step S110 of reversal-baking and the step S112 of flood exposing may be omitted.

In the embodiments described above, both the first and the second silicon oxide films are formed using the sputtering device, but alternatively, for example, the first silicon oxide film may be formed using a sputtering technique, and the second silicon oxide film may be formed using a CVD method. Meanwhile, in the case in which the electrode has already been formed before the first and the second silicon oxide films are formed, the first and second silicon oxide films are preferably formed by using a sputtering technique only. Patterning of the silicon oxide films by using dry etching may cause a damage in the electrode. Thus, patterning by lift-off is preferable. However, the photoresist for lift-off may not endure under a high temperature condition in a CVD method. In such a case, the first and the second silicon oxide films are preferably formed by sputtering.

In forming a film on a semiconductor wafer by using a sputtering technique, a film-forming condition may be varied according to factors such as a specification and a configuration of the sputtering device, or according to a relative position between the semiconductor wafer and a sputter target. Thus, film-forming conditions for forming the first and the second silicon oxide films may be different from the conditions of the embodiments described above.

Note that a portion of a configuration in a certain embodiment may be replaced with or added to a configuration in another embodiment. Also, a portion of a configuration in each embodiment may be added to or replaced with another portion of the configuration thereof.

What is claimed is:

1. A method of manufacturing a semiconductor element, the method comprising:
   forming a first silicon oxide film on a semiconductor wafer under a first film forming condition;
   forming a second silicon oxide film on the first silicon oxide film under a second film forming condition, a density of the second silicon oxide film being lower than a density of the first silicon oxide film;
   coating, with a photoresist, a region including the second silicon oxide film;
   exposing the photoresist using a photomask, the photomask having at least one aperture and being disposed such that at least a portion of an edge of the at least one aperture is disposed on the second silicon oxide film;
   removing a portion of the photoresist using a developer solution so as to form a photoresist pattern that has an overhang shape in a cross-section of the photoresist pattern;
   forming an electrode film on a region including the photoresist pattern; and
   performing lift-off by removing the photoresist pattern, to remove an unnecessary portion of the electrode film.

2. The method of manufacturing a semiconductor element according to claim 1, wherein:
   the photoresist is a positive resist; and
   the method further comprises, between the step of exposing and the step of developing:
      reversal-baking the photoresist so that an exposed portion of the photoresist becomes insoluble to the developer solution, and
      exposing an entirety of a surface of the photoresist.

3. The method of manufacturing a semiconductor element according to claim 1, wherein:
   in the step of forming the first silicon oxide film, the first silicon oxide film is formed by using a sputtering device at a deposition pressure of 0.2 Pa or less; and in the step of forming the second silicon oxide film, the second silicon oxide film is formed by using a sputtering device at a deposition pressure of 0.4 Pa or more.

4. The method of manufacturing a semiconductor element according to claim 3, wherein, in the step of forming the second silicon oxide film, the second silicon oxide film is formed at a deposition pressure of 0.7 Pa or less.

5. The method of manufacturing a semiconductor element according to claim 1, further comprising:
   before the step of forming the first silicon oxide film, forming a conductive oxide film on the semiconductor wafer; and
   wherein, in the step of forming the first silicon oxide film, the first silicon oxide film is disposed to be in contact with the conductive oxide film.

6. The method of manufacturing a semiconductor element according to claim 5, wherein a thickness of the second silicon oxide is one quarter or less of a total of a thickness of the first silicon oxide film and a thickness of the second silicon oxide film.

7. The method of manufacturing a semiconductor element according to claim 5, wherein the semiconductor element is a semiconductor laser element.

8. The method of manufacturing a semiconductor element according to claim 1, further comprising, before the step of forming the first silicon oxide film, providing the semiconductor wafer, which comprises an n-side semiconductor layer, an active layer, and a p-side semiconductor layer.

9. The method of manufacturing a semiconductor element according to claim 8, wherein, in the step of providing the semiconductor wafer, the n-side semiconductor layer comprises an n-type GaN semiconductor layer, the active layer comprises GaN barrier layers and InGaN well layers that are alternately layered, and the p-side semiconductor layer comprises a p-type semiconductor layer.

10. A method of manufacturing a semiconductor element, the method comprising:
   providing a semiconductor wafer comprising an n-side semiconductor layer, an active layer, a p-side semiconductor layer comprising a ridge, and a first electrode formed on the ridge;
   forming a first silicon oxide film on the semiconductor wafer under a first film forming condition, at least a part of the first silicon oxide film covering surfaces of the p-side semiconductor layer at both sides of the ridge;
   forming a second silicon oxide film on the first silicon oxide film under a second film forming condition, a density of the second silicon oxide film being lower than a density of the first silicon oxide film;
   coating, with a photoresist, a region including the second silicon oxide film;
   exposing the photoresist using a photomask, the photomask having at least one aperture above the first electrode and being disposed such that at least a portion of an edge of the at least one aperture is disposed on the second silicon oxide film;
   removing a portion of the photoresist using a developer solution to form a photoresist pattern that has an overhang shape in a cross-section of the photoresist pattern;
   forming an electrode film on a region including the photoresist pattern and the first electrode; and
   performing lift-off by removing the photoresist pattern, to remove an unnecessary portion of the electrode film.

11. The method of manufacturing a semiconductor element according to claim 10, wherein:
   the photoresist is a positive resist; and
   the method further comprising, between the step of exposing and the step of developing:
      reversal-baking the photoresist so that an exposed portion of the photoresist becomes insoluble to the developer solution, and
      exposing an entirety of a surface of the photoresist.

12. The method of manufacturing a semiconductor element according to claim 10, wherein:
   in the step of forming the first silicon oxide film, the first silicon oxide film is formed by using a sputtering device at a deposition pressure of 0.2 Pa or less; and
   in the step of forming the second silicon oxide film, the second silicon oxide film is formed by using a sputtering device at a deposition pressure of 0.4 Pa or more.

13. The method of manufacturing a semiconductor element according to claim 12, wherein, in the step of forming the second silicon oxide film, the second silicon oxide film is formed at a deposition pressure of 0.7 Pa or less.

14. The method of manufacturing a semiconductor element according to claim 10, further comprising:
   before the step of forming the first silicon oxide film, forming a conductive oxide film on the semiconductor wafer;
   wherein, in the step of forming the first silicon oxide film, the first silicon oxide film is disposed to be in contact with the conductive oxide film.

15. The method of manufacturing a semiconductor element according to claim 14, wherein a thickness of the second silicon oxide film is one quarter or less of a total of a thickness of the first silicon oxide film and a thickness of the second silicon oxide film.

16. The method of manufacturing a semiconductor element according to claim 14, wherein the semiconductor element is a semiconductor laser element.

* * * * *